United States Patent [19]
Kung et al.

[11] Patent Number: 5,998,255
[45] Date of Patent: Dec. 7, 1999

[54] METHOD OF FABRICATING DRAM CAPACITOR

[75] Inventors: Cheng-Chih Kung, Miaoli; Peter Chou, Taipei, both of Taiwan

[73] Assignee: United Silicon Incorporated, Taipei, Taiwan

[21] Appl. No.: 09/145,711

[22] Filed: Sep. 2, 1998

[30] Foreign Application Priority Data

Jun. 9, 1998 [TW] Taiwan .................................. 87109134

[51] Int. Cl.$^6$ .............................................. H01L 21/8242
[52] U.S. Cl. ............................................ 438/252; 438/253
[58] Field of Search ..................................... 438/238–240, 438/250–256, 381, 393–399

[56] References Cited

U.S. PATENT DOCUMENTS

| | | | |
|---|---|---|---|
| 5,789,290 | 8/1998 | Sun | 438/253 |
| 5,902,126 | 5/1999 | Hong et al. | 438/396 |

Primary Examiner—Jey Tsai
Attorney, Agent, or Firm—Thomas, Kayden, Horstemeyer & Risley

[57] ABSTRACT

A fabricating method for a DRAM capacitor is provided. A DRAM is formed on a substrate, wherein a transistor has been formed. A first oxide layer is formed over the substrate and a contact window is formed on the first oxide layer to expose a source region of the transistor. Then, a bit line is formed in the contact window, wherein the bit line is connected to the source region of the transistor. A second oxide layer is formed on the bit line and the first oxide layer. Then, a third oxide layer is formed on the second oxide layer. A second contact window is further defined to expose a drain region of the transistor, wherein the drain region has a native oxide layer formed on it. Next, a first polysilicon film is formed on the exposed drain region of the second contact window. A high dosage implantation is used to remove the native oxide layer. Then, a second polysilicon layer is formed over the substrate. Finally, the finishing process followed is performed to complete the fabrication of a DRAM capacitor.

30 Claims, 7 Drawing Sheets

METHOD OF FABRICATING DRAM CAPACITOR

CROSS-REFERENCE TO RELATED APPLICATION

This application claims the priority benefit of Taiwan application serial no. 87109134, filed Jun. 9, 1998, the full disclosure of which is incorporated herein by reference.

BACKGROUND OF THE INVENTION

1. Field of the Invention

The invention relates in general to the fabrication of semiconductor integrated circuits (ICs), and more particularly to a fabricating method of a DRAM (dynamic random access memory) capacitor. In this fabricating method, a native oxide layer is removed to lower a contact resistance of a node and the node junction fully surrounds the node to lower the junction current leakage.

2. Description of the Related Art

DRAM is a widely used IC device, and more particularly it plays an important role in the present technology. FIG. 1 shows a schematic drawing of a DRAM cell. The memory cell includes a transfer transistor T and a storage capacitor C. The source region of the transfer transistor T is connected to a corresponding bit line BL, the drain region of the transistor T is connected to a storage electrode 10 of a the storage capacitor C, and the gate is connected to a corresponding word line WL. An opposing electrode 12 of the storage capacitor C is connected to a constant voltage source region $V_{CP}$. Between the storage electrode 10 and the opposing electrode 12, there is a dielectric layer 11. As practitioners skilled in the art know, the storage capacitor C should be large enough to protect the storage data from loss.

FIGS. 2A–2H are cross-sectional views showing a conventional process of fabricating a DRAM capacitor.

Referring to FIG. 2A, a substrate 20 is provided on which an isolation region 21 is formed to define a device region. The isolation region 21 is, for example, a shallow trench isolation region or a field oxide region.

Then, a transistor is formed on the device region, wherein the transistor includes a gate electrode 22, a drain region 24a, a source region 24b, and a gate oxide layer 23 which is under the gate electrode 22. The gate electrode 22 is a doped polysilicon which is formed by depositing a polysilicon layer using CVD (chemical vapor deposition), and the polysilicon layer is further implanted with dopant. Then, lightly doped regions, for example, drain regions 24a and source region 24b, are formed. Next, spacers 25 are formed on the sides of the gate electrode 22, wherein the spacers are silicon nitride. Finally, the source region 24b is further implanted to form a heavily doped region.

Referring to FIG. 2B, an oxide layer 26 is formed over the substrate 20. Then, the oxide layer 26 is defined by forming a photoresist layer. For example, the oxide layer 26 is etched by dry etching to form a contact window 28 and expose the source region 24b. After the contact window 28 is formed, the photoresist layer is removed.

Referring to FIG. 2C, a doped polysilicon layer (not shown) is deposited in the contact window 28 and on the oxide layer 26 by CVD, wherein the polysilicon layer is connected to the source region 24b. Then the doped polysilicon layer is defined, by conventional lithography technology, to form a bit line 30.

Referring to FIG. 2D, an oxide layer 32 deposited over the substrate to cover the bit line 30 and the oxide layer 26 by APCVD. Next, an oxide layer 34 is formed over the oxide layer 32 by PECVD, wherein the oxide layer 34 is BPSG.

Referring to FIG. 2E, a photoresist layer (not shown) is formed to cover part of the oxide layer 34. Then the oxide layer 34, 32, 26 are etched according to the photoresist layer to form a contact window 36 which exposes the drain region 24a. Then, the photoresist layer is removed. The drain region 24a is implanted to form a heavily doped region. Because of the deep node 40 and the shadow effect of the ion implanting process, the node junction 39 can not fully surround the node 40. Therefore, a junction leakage occurs at the outer node junction 41 as shown in FIG. 2E.

Then, a thermal process, for example, a rapid thermal process (RTP), is performed to activate the implanted ions. Necessarily, a native oxide layer will be formed on the surface of the node 40. The native oxide layer will raise the contact resistance of the node 40 and result in difficulty in operating a memory cell.

Referring to FIG. 2F, a polysilicon layer 38 is deposited on the oxide layer 34 and fills in the contact window 36 to make contact with the exposed drain region 24a, wherein the thickness of the polysilicon layer 38 should be enough to provide the needed capacitance. As described above, the native oxide layer is formed on the surface of the node 40 and causes difficulty in operating the memory cell.

Referring to FIG. 2G, the polysilicon layer 38 is defined by conventional lithography technology as shown in FIG. 2G, wherein the polysilicon layer 38 is a lower electrode of a capacitor.

Referring to FIG. 2H, a dielectric layer 46 is formed on the lower electrode 38, wherein the lower electrode 38 is an oxide/nitride/oxide (O/N/O) layer. Then, an upper electrode 48 is formed over the dielectric layer 46.

The conventional finishing process is performed to complete the fabrication of a DRAM capacitor and the finishing process is not described here.

To sum up, the conventional fabricating method of a DRAM capacitor includes at least the following defects:

(1) Because of the deep node and the shadow effect of the ion implanting process, the node junction cannot fully surround the node and thus induces junction leakage.

(2) In forming the polysilicon layer of the lower electrode, a native oxide layer will necessarily be formed on the surface of the substrate and rise the contact resistance to result in operational difficulties for the memory cell.

SUMMARY OF THE INVENTION

It is therefore an object of the invention to provide an improved and simplified process of fabricating a DRAM capacitor, wherein the native oxide layer between a substrate and a polysilicon layer is removed. As a result, the contact resistance on the node is reduced to ensure good operation of a DRAM capacitor.

It is another object of the invention to provide an improved process of fabricating a DRAM capacitor, wherein the dopeds polysilicon layer is used as a doping source region to ensure that the node junction can fully surround the node in the process as followed and reduce the junction leakage.

The invention achieves the above-identified objects by providing a method of fabricating a DRAM capacitor, wherein the DRAM capacitor is formed on a substrate. First of all, a transistor is formed on the substrate and a first oxide layer is formed over the substrate. Then, a contact window is formed on the first oxide layer to expose a source region of the transistor. Next, a bit line is formed in the contact window, wherein the bit line is connected to the source region of the transistor. A second oxide layer is formed on the bit line and the first oxide layer. Then, a third oxide layer is formed on the second oxide layer. A second contact window is further defined to expose a drain region of the transistor, wherein a native oxide layer is on the drain region. Next, a first polysilicon film is formed on the exposed drain region of the second contact window. A high dosage implantation is used to remove the native oxide layer. Then, a polysilicon layer is formed over the substrate. Finally, the finishing process is performed to complete the fabrication of a DRAM capacitor.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1:
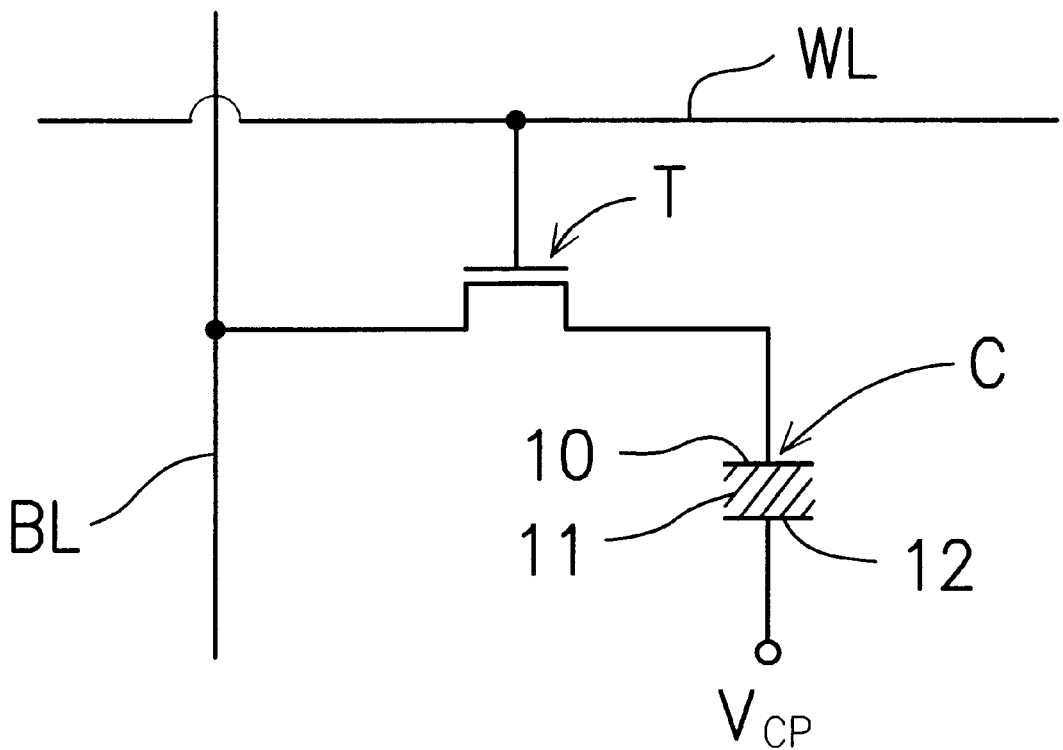
FIG. 1 is a schematic drawing of a DRAM capacitor.
Figure 2A:
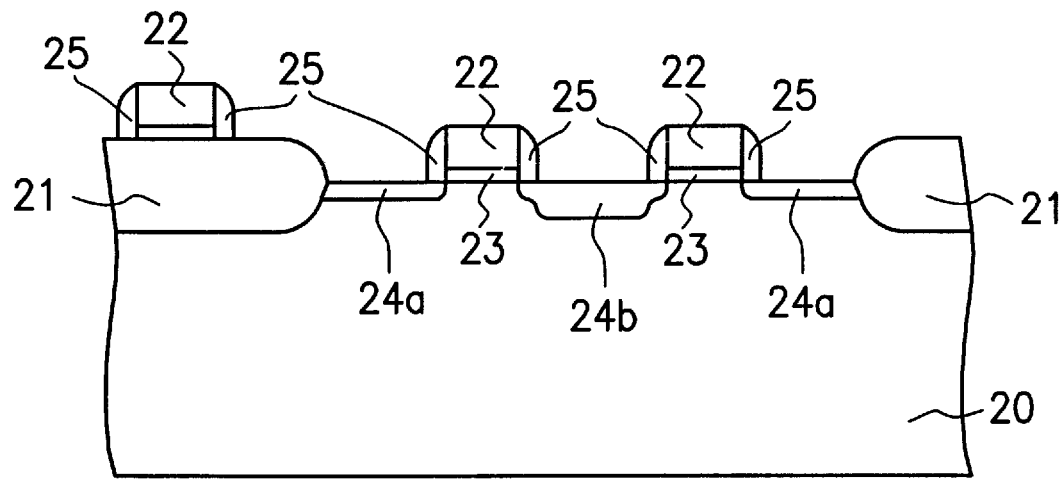
FIGS. 2A to 2H (Prior Art) are cross-sectional views showing a conventional process of fabricating a DRAM capacitor.
Figure 2B:
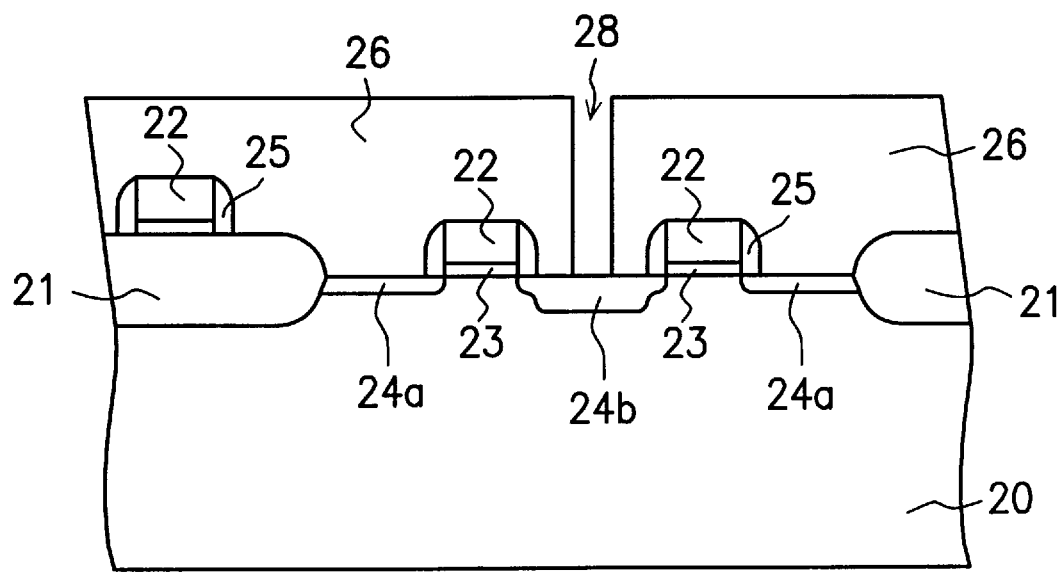
Figure 2C:
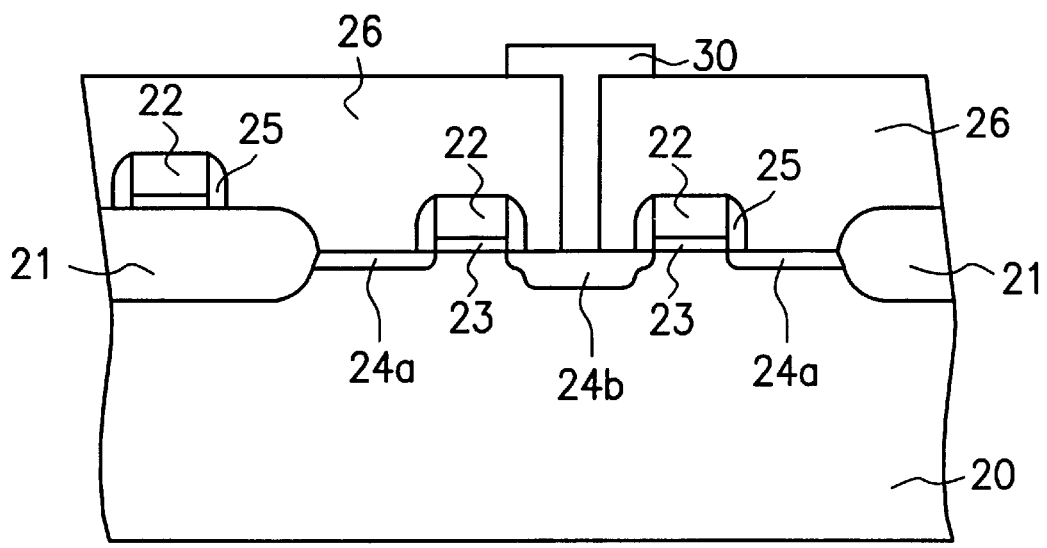
Figure 2D:
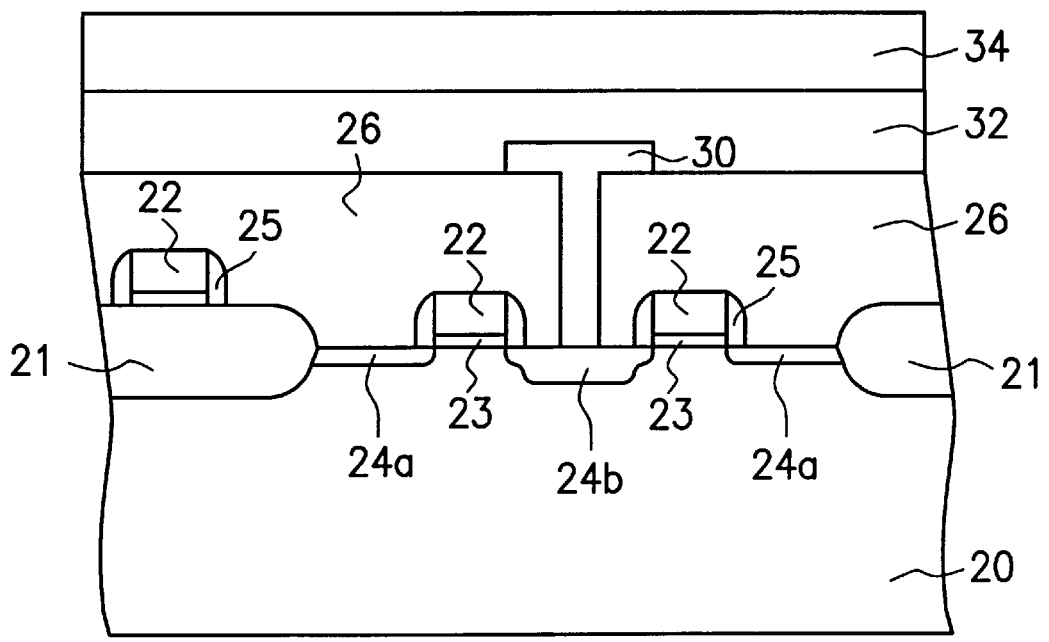
Figure 2E:
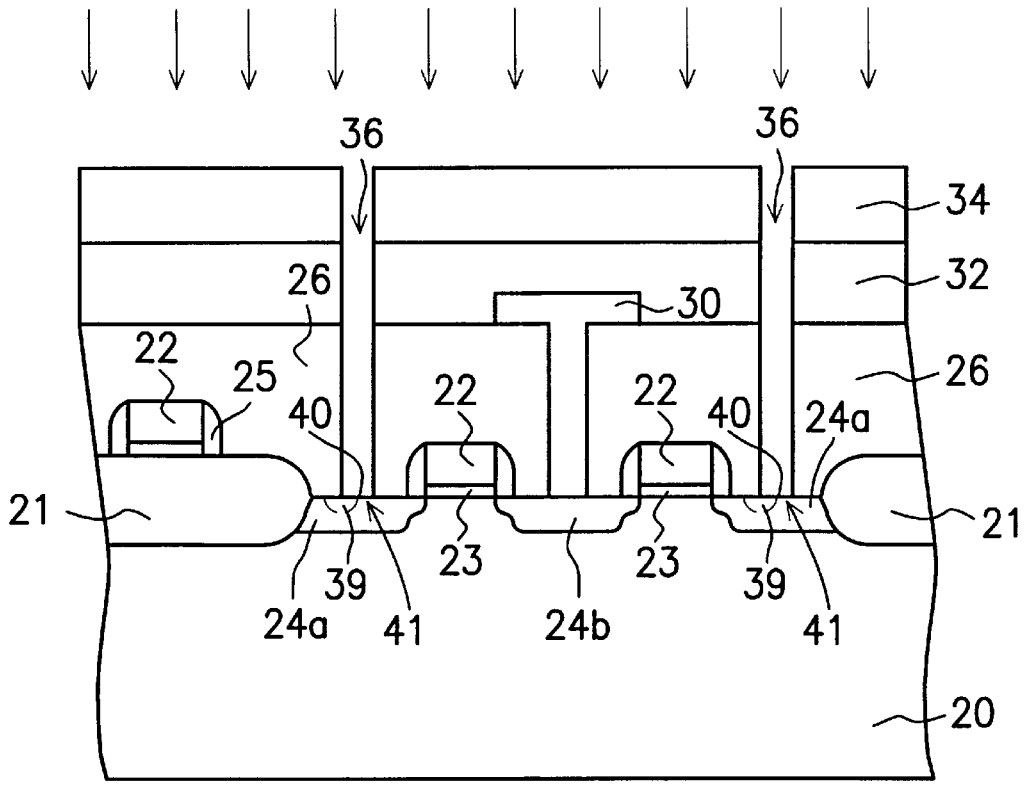
Figure 2F:
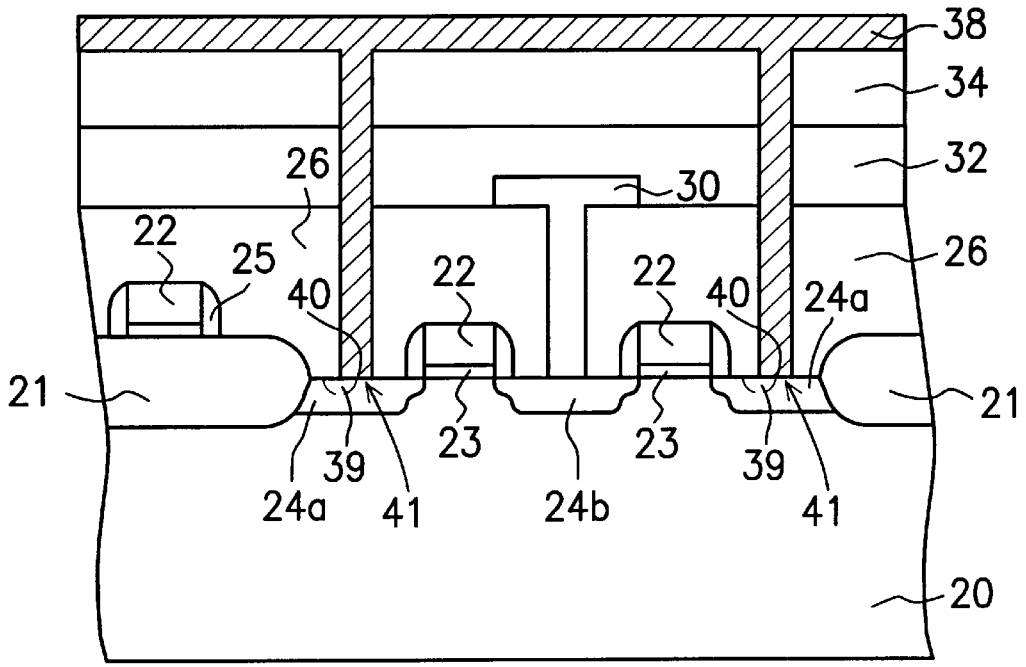
Figure 2G:
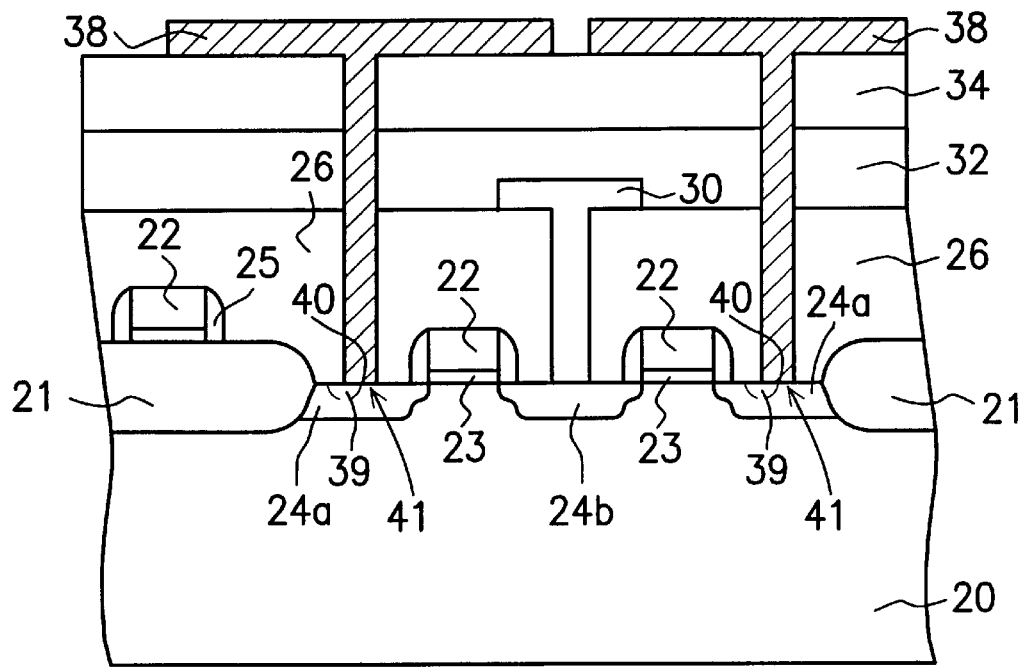
Figure 2H:
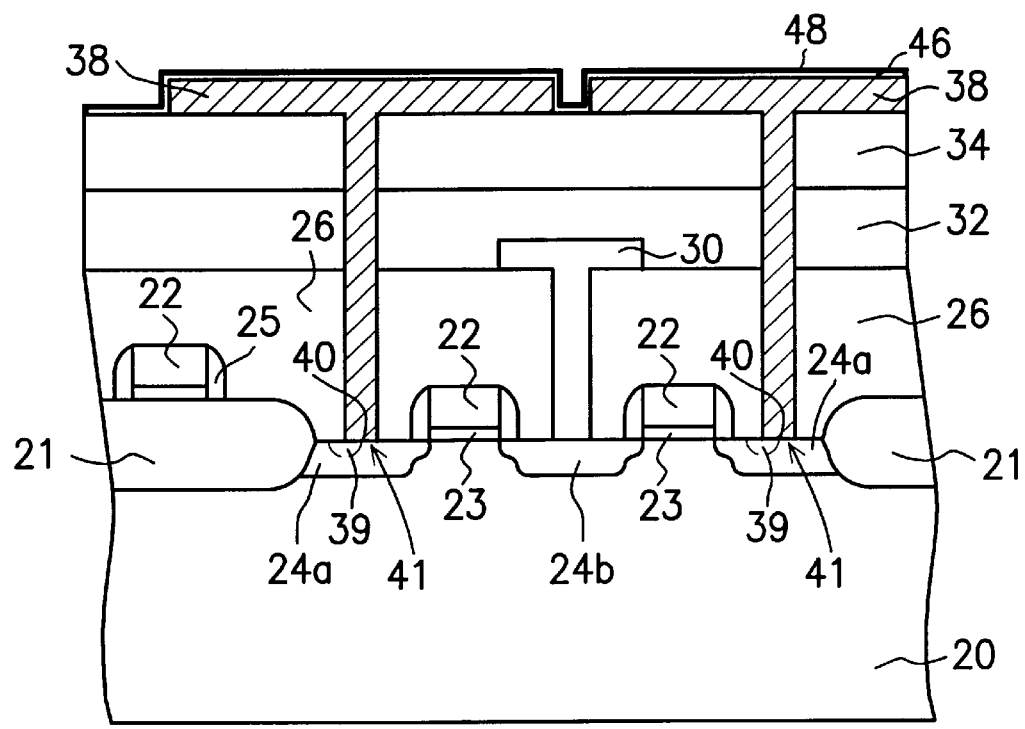

FIGS. 2A to 2E and FIGS. 3A to 3D show the method of fabricating a DRAM capacitor according to a preferred embodiment of the present invention. In this embodiment, since most of the techniques used in the initial stages of the fabricating the DRAM capacitor are similar to the conventional techniques, for example, the resulting structure shown in FIGS. 2A through 2E, a detailed description of these initial stages are omitted. Instead, using the structure shown in FIG. 2E as a base, only the subsequent fabricating processes are described. Also, to simplify the explanation, elements in this embodiment which are identical to those shown in FIG. 2E are labeled with the same numerals.

Figure 3A:
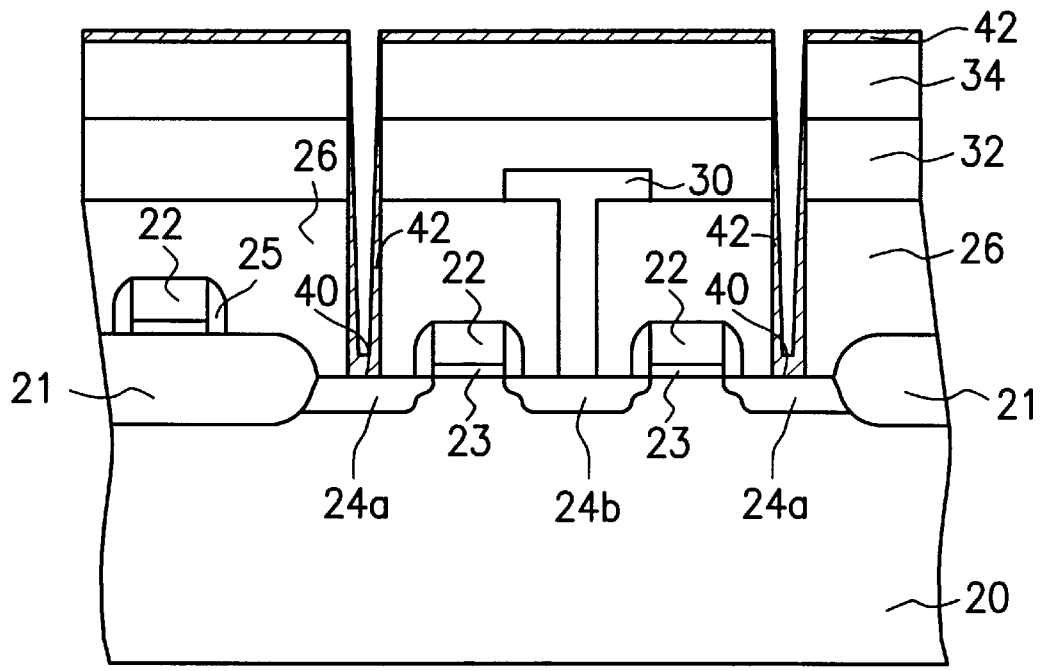
FIGS. 3A to 3D are cross-sectional views showing the process steps of one preferred embodiment of the method for fabricating a DRAM capacitor.

Based on the wafer structure shown in FIG. 2E, after the formation of a contact window 36, a polysilicon film 42 is formed on the oxide layer 34, side walls of the oxide layer 34, 32, and 26, and the exposed drain region 24a as shown in FIG. 3A. The thickness of the polysilicon film 42 is about 500–1000 Å. Then, the polysilicon film 42 is implanted by high dosage implantation using, for example, phosphorous at the dosage of about $10^{15}$–$5\times10^{15}$ cm$^{-2}$ and at the energy of about 40–50 KeV, to pierce the polysilicon film 42 and the native oxide on the substrate 20. The polysilicon film 42 and the native oxide on the substrate 20 are damaged to lower the contact resistance of the node 40.

Besides, the doped polysilicon film 42 can be used as a dopant source region in the following thermal process. After the thermal process, the node junction 39 can fully surround the node 40 to lower the junction leakage at the outer node junction 41.

Figure 3B:
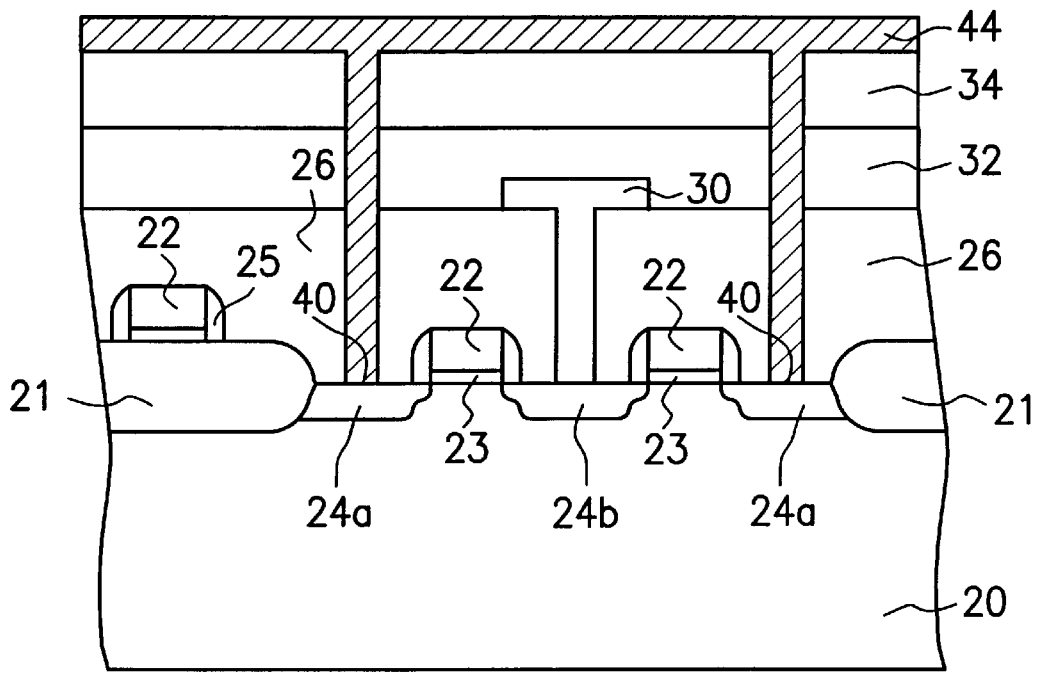

Referring to FIG. 3B, a doped polysilicon layer 44 is formed over the polysilicon film 42 by LPCVD, wherein the doped polysilicon layer 44 is about 4000 Å thick.

Figure 3C:
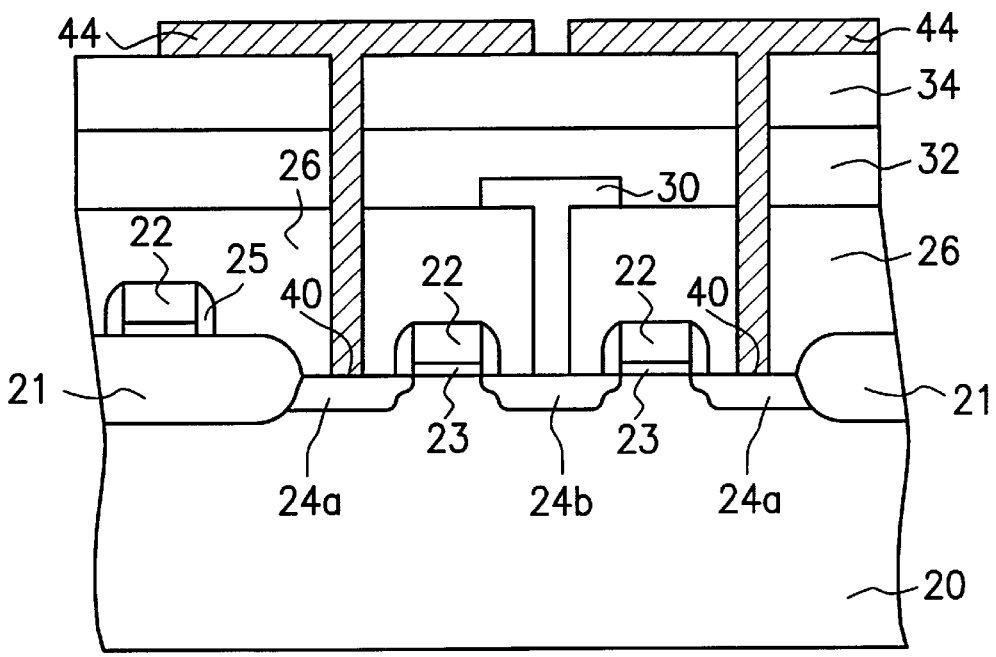
Figure 3D:
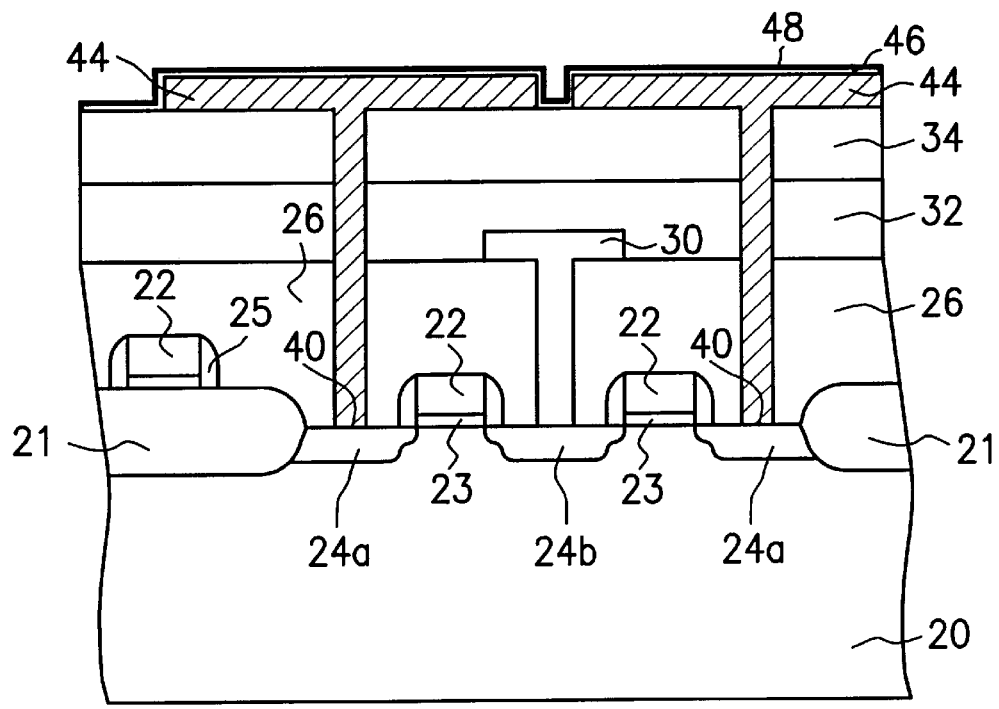

Referring to FIG. 3C, the polysilicon layer 44 is etched to form a lower electrode of a capacitor. Next, a dielectric layer 46 is formed over the polysilicon layer 44 as shown in FIG. 3D, wherein the dielectric layer 46 is an oxide-nitride-oxide (O/N/O) layer. Then, an upper electrode 48 is formed over the dielectric layer 46.

The conventional finishing process is performed to complete the fabrication of a DRAM capacitor and the finishing process is not described here.

To sum up, the first characteristic of the invention is to deposit a polysilicon film and then the native oxide layer between the polysilicon film, and the substrate is pierced by high dosage implantation. Then, the contact resistance of the node is reduced to ensure good operation of a DRAM capacitor.

The second characteristic of the invention is to use a doped polysilicon layer as a doping source region to ensure that the node junction can fully surround the node in the process as followed and reduce the junction leakage.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A fabricating method of a DRAM capacitor, comprising the steps of:

forming a transistor on a substrate, wherein the transistor includes at least a spacer on a side wall;

forming a first oxide layer over the transistor and the substrate, wherein a first contact window is further formed to expose a source region of the transistor;

forming a bit line in the contact window, wherein the bit line is connected to the source region of the transistor;

forming a second oxide layer on the bit line and the first oxide layer;

forming a third oxide layer on the second oxide layer;

defining the third oxide layer, the second oxide layer, and the first oxide layer to form a second contact window to expose a drain region of the transistor, wherein a native oxide layer is on the drain region;

forming a first polysilicon film on the second contact window;

implanting the polysilicon film by high dosage implantation to remove the native oxide layer;

forming a second polysilicon layer on the first polysilicon film and over the substrate, wherein the second polysilicon layer and the first polysilicon film form a lower electrode of the DRAM capacitor;

forming a dielectric layer on the lower electrode; and forming an upper electrode on the dielectric layer.

2. A fabricating method according to claim 1, wherein the first oxide layer is formed by LPCVD.

3. A fabricating method according to claim 1, wherein the second oxide layer is formed by APCVD.

4. A fabricating method according to claim 1, wherein the third oxide layer is formed by PECVD.

5. A fabricating method according to claim 1, wherein the spacer is silicon nitride.

6. A fabricating method according to claim 1, wherein the bit line is doped polysilicon.

7. A fabricating method according to claim 1, wherein the third oxide layer is BPSG.

8. A fabricating method according to claim 1, wherein the dielectric layer is O/N/O.

9. A fabricating method according to claim 1, wherein the first contact window is formed by dry etching.

10. A fabricating method according to claim 1, wherein the first polysilicon layer is formed by LPCVD.

11. A fabricating method according to claim 1, wherein the thickness of the first polysilicon layer is 500–1000 Å.

12. A fabricating method according to claim 1, wherein the high dosage implantation is a phosphorous implantation.

13. A fabricating method according to claim 1, wherein the second polysilicon layer is formed by LPCVD.

14. A fabricating method according to claim 1, wherein the thickness of the second polysilicon layer is about 4000 Å.

15. A fabricating method according to claim 1, wherein the upper electrode is doped polysilicon.

16. A fabricating method according to claim 1, wherein the native oxide layer is formed by thermal process.

17. A fabricating method according to claim 16, wherein the thermal process is RTP.

18. A fabricating method of a DRAM capacitor, wherein the DRAM capacitor is formed on an active region of a substrate, the fabricating method comprising the steps of:

forming an oxide layer over the substrate;

forming a contact window to expose the active region, wherein there is a native oxide layer on the active region;

forming a first polysilicon film on the active region of the contact window;

performing a high dosage implantation on the polysilicon film to remove the native oxide layer;

forming a second polysilicon layer on the first polysilicon film and over the substrate, wherein the second polysilicon layer and the first polysilicon film form a lower electrode;

forming a dielectric layer on the lower electrode; and forming an upper electrode on the dielectric layer.

19. A fabricating method according to claim 18, wherein the oxide layer is formed by LPCVD.

20. A fabricating method according to claim 18, wherein the oxide layer is formed by PECVD.

21. A fabricating method according to claim 18, wherein the contact window is formed by dry etching.

22. A fabricating method according to claim 18, wherein the native oxide layer is formed by a thermal process.

23. A fabricating method according to claim 22, wherein the thermal process is RTP.

24. A fabricating method according to claim 18, wherein the first polysilicon film is formed by LPCVD.

25. A fabricating method according to claim 18, wherein the thickness of the first polysilicon film is 500–1000 Å.

26. A fabricating method according to claim 18, wherein the high dosage implantation is a phosphorous implantation.

27. A fabricating method according to claim 18, wherein the second polysilicon layer is formed by LPCVD.

28. A fabricating method according to claim 18, wherein the thickness of the second polysilicon layer is about 4000 Å.

29. A fabricating method according to claim 18, wherein the dielectric layer is O/N/O.

30. A fabricating method according to claim 18, wherein the upper electrode is doped polysilicon.

\* \* \* \* \*